(12) United States Patent
Huang et al.

(10) Patent No.: US 12,354,684 B2
(45) Date of Patent: Jul. 8, 2025

(54) MANAGING AN ADAPTIVE DATA PATH SELECTION THRESHOLD FOR A MEMORY SUB-SYSTEM

(71) Applicant: Micron Technology, Inc., Boise, ID (US)

(72) Inventors: Jian Huang, Union City, CA (US); Zhenming Zhou, San Jose, CA (US); Murong Lang, San Jose, CA (US); Zhongguang Xu, San Jose, CA (US); Jiangli Zhu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 346 days.

(21) Appl. No.: 17/580,105

(22) Filed: Jan. 20, 2022

(65) Prior Publication Data

US 2023/0207028 A1 Jun. 29, 2023

Related U.S. Application Data

(60) Provisional application No. 63/293,240, filed on Dec. 23, 2021.

(51) Int. Cl.
*G11C 16/34* (2006.01)
*G11C 16/10* (2006.01)
*G11C 16/16* (2006.01)
*G11C 16/26* (2006.01)

(52) U.S. Cl.
CPC ........ *G11C 16/3495* (2013.01); *G11C 16/102* (2013.01); *G11C 16/16* (2013.01); *G11C 16/26* (2013.01); *G11C 16/349* (2013.01)

(58) Field of Classification Search
CPC ... G11C 16/3495; G11C 16/102; G11C 16/16; G11C 16/26; G11C 16/349; G11C 16/3404; G11C 29/42; G11C 29/44; G11C 29/52; G11C 16/10; G11C 16/14; G11C 16/08; G06F 11/1068; G06F 12/0246
See application file for complete search history.

(56) References Cited

U.S. PATENT DOCUMENTS

| | | | |
|---|---|---|---|
| 7,466,597 B2 * | 12/2008 | Kim | G11C 16/105 365/185.28 |
| 2014/0301142 A1 * | 10/2014 | Stoev | G11C 11/5628 365/185.09 |
| 2016/0124679 A1 * | 5/2016 | Huang | G06F 12/0223 711/103 |
| 2016/0231983 A1 | 8/2016 | Koppens et al. | |
| 2016/0232983 A1 * | 8/2016 | Khurana | G11C 11/56 |
| 2020/0364103 A1 * | 11/2020 | Sharifi Tehrani | G06F 11/0727 |
| 2021/0004159 A1 * | 1/2021 | Pletka | G06F 12/0246 |

* cited by examiner

*Primary Examiner* — Alexander Sofocleous
*Assistant Examiner* — James S Wells
(74) *Attorney, Agent, or Firm* — Lowenstein Sandler LLP

(57) ABSTRACT

A threshold criterion of a plurality of threshold criteria is identified based on a current program-erase cycle (PEC) count of a first block of a memory device, wherein the first block is configured as quad-level cell (QLC) memory. A raw bit error rate (RBER) associated with data of a second block of the memory device is determined, wherein the second block is configured as single-level cell (SLC) memory. It is determined that the RBER associated with the data of the second block satisfies the threshold criterion. In response to determining that the RBER satisfies the threshold criterion, the data of the second block is written to the first block.

6 Claims, 6 Drawing Sheets

300

| PEC Range 301 | PEC Range 303 | PEC Range 305 | PEC Range 307 | PEC Range 309 |
|---|---|---|---|---|
| RBER Threshold 302 | RBER Threshold 304 | RBER Threshold 306 | RBER Threshold 308 | RBER Threshold 310 |

MANAGING AN ADAPTIVE DATA PATH SELECTION THRESHOLD FOR A MEMORY SUB-SYSTEM

RELATED APPLICATION

This application claims the benefit under 35 U.S.C. § 119(e) to U.S. Provisional Patent Application No. 63/293,240, filed on Dec. 23, 2021, which is herein incorporated by reference in its entirety.

TECHNICAL FIELD

Embodiments of the disclosure relate generally to memory sub-systems, and more specifically, relate to managing an adaptive data path selection threshold for a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
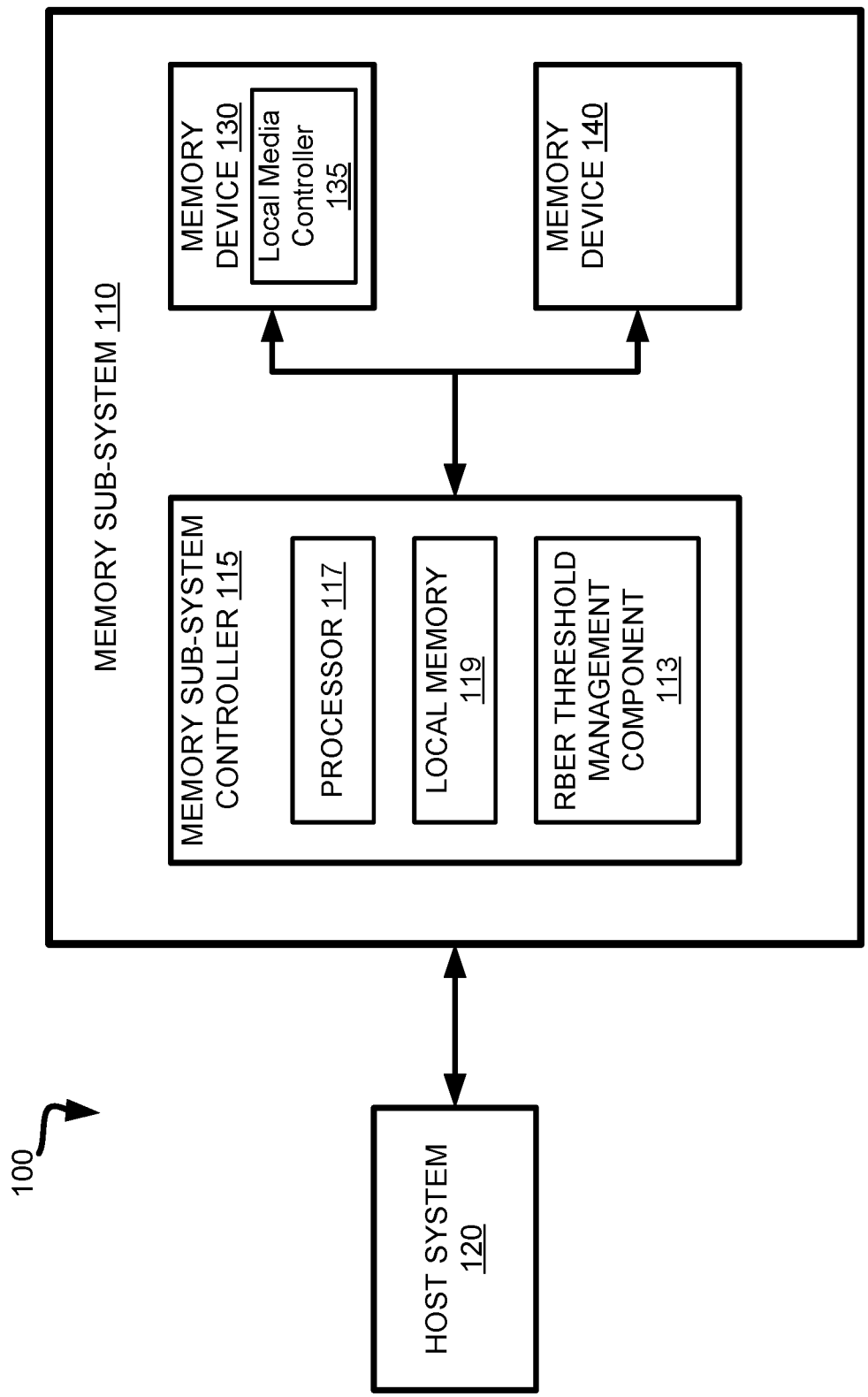
FIG. 1 illustrates an example computing system that includes a memory sub-system in accordance with some embodiments of the present disclosure.

Aspects of the present disclosure are directed to managing an adaptive data path selection threshold for a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

The memory sub-system can include multiple memory devices that can store data received from the host system. The memory devices can include a different type of media. Examples of media include, but are not limited to, a cross-point array of non-volatile memory and flash-based memory such as single-level cell (SLC) memory, triple-level cell (TLC) memory, and quad-level cell (QLC) memory. Different types of media can have different data density. Data density corresponds to an amount of data (e.g., bits of data) that can be stored per memory cell of a memory device. Using the example of a flash based memory, a quad-level cell (QLC) can store four bits of data while a single-level cell (SLC) can store one bit of data. Accordingly, a memory device including QLC memory cells will have a higher data density than a memory device including SLC memory cells.

Certain memory sub-systems implementing QLC memory use a 16-16 course-fine, two pass, programming algorithm. Since a QLC memory cell stores four bits of data, there are 16 possible programming levels (i.e., $2^4$) representing the possible values of those four bits of data. Programming a wordline begins by coarsely programming all 16 levels in a first pass. The objective of this "coarse," first pass is to program all cells rapidly to slightly below their final target programming levels. During the slower, "fine," second pass, the memory cells are programmed to a slightly higher final target programmed voltage. Such two-pass programming minimizes cell to cell (C2C) interference, as every cell and its neighbors are nearly at their final target programmed voltage when the fine programming pass is performed, and need only be "touched-up." The combination of not requiring precision programming in the first pass, and the minimized C2C coupling, leads to fast programming with high read window budget (RWB). Such 16-16 coarse-fine programming, however, requires all data to be first written to single level cell (SLC) memory (i.e., memory cells storing one bit of data per cell) before the first pass to protect against asynchronous power loss (APL) as well as to limit buffer utilization and keep data available for host reads.

The data can then be moved from SLC memory to other memory, such as MLC memory, TLC, memory, QLC memory, etc., via an on-chip copyback operation. The copyback operation can involve moving data from SLC memory to QLC memory, for example, using a cache register. In conventional memory sub-systems, moving the data from SLC memory to QLC memory can include reading the data from the SLC cache. A memory sub-system controller can then determine which data path out of typically two data paths to take. One data path involves directly sending the read data to the QLC memory. The other data path involves performing an error correction code (ECC) decoding operation to correct the data and then send the corrected data to the QLC memory. In conventional memory sub-systems, a memory sub-system controller chooses a data path based on a raw bit error rate (RBER) threshold. In order to choose a data path based on an RBER threshold, the memory sub-system controller can determine whether the RBER of the read data is higher than the RBER threshold. If the RBER of the read data is higher than the RBER threshold, the memory sub-system controller chooses the data path, performs an ECC decoding operation on the read data, and sends the corrected data to QLC memory. Selecting this data path can result in higher latency since there is an additional step of performing an ECC decoding operation, but there is a lower reliability risk since errors in the data are corrected. In contrast, if the RBER of the read data is less than the RBER threshold, the memory sub-system chooses the data path that directly sends the read data to the QLC memory without performing an ECC decoding operation. Selecting this data path can result in a higher reliability risk since errors in the data are not corrected, but there is lower latency since the data is sent directly to QLC memory without any additional steps. Therefore, selecting an RBER threshold that balances latency and reliability can be desired. However, the RBER for a particular data can vary across the drive life of a memory device. Conventional memory devices typically have lower RBER in data at earlier stages in a drive life in comparison to later stages in the drive life. For example, RBER can vary depending on a number of program-erase cycles (PEC) associated with the memory device. PEC refers to the number of times a group of memory cells is erased and subsequently programmed with new data. In conventional memory devices, there can be a lower RBER for lower numbers of PEC, whereas there can be a higher RBER for higher numbers of PEC. In such cases, it can be desirable to have a lower RBER threshold if there is a higher RBER (in order to ensure reliability), while it can be desirable to have a higher RBER threshold if there is a lower RBER (in order to improve latency). Thus, it can be difficult to select an RBER threshold that balances latency and reliability when the RBER for a particular data varies across the drive life of the memory device.

Aspects of the present disclosure address the above and other deficiencies by having a memory sub-system that manages an adaptive data path selection threshold. When performing a copyback operation, a memory sub-system controller can use different RBER thresholds for different PEC ranges in order to balance latency and reliability when selecting a data path. For example, a memory sub-system controller can keep track of the PEC of a destination QLC block. In response to receiving a request to perform a copyback operation (e.g., move data from SLC memory to QLC memory), the memory sub-system controller can look up (e.g., in a look-up table) a corresponding RBER threshold according to the PEC of the destination QLC block. There can be different RBER thresholds set for different ranges of PEC based on media characterization data (i.e., offline testing of the memory device under different workloads during manufacturing). After looking up the RBER threshold corresponding to the PEC of the destination QLC block, the memory sub-system controller can compare the RBER of the data to be moved from the SLC memory (i.e., the source data) to the RBER threshold. Thus, the memory sub-system controller can select a data path (e.g., directly moving the source data to the destination QLC block or first performing an ECC decoding operation and then moving the corrected source data to the destination QLC block) using an RBER threshold that is based on the PEC of the destination QLC block instead of using the same RBER threshold throughout the drive life of a memory device.

Advantages of the present disclosure include, but are not limited to, balancing latency and reliability of a memory device when performing a copyback operation by using an adaptive RBER threshold that corresponds to different ranges of PEC. Since conventional memory devices typically have lower RBER in data during the beginning of life of a memory device, there can be an improvement in latency at the beginning of life by using, e.g., a higher RBER threshold for lower ranges of PEC. Similarly, since conventional memory devices typically have higher RBER in data during the end of life of a memory device, there can be an improvement of reliability at the end of life by using, e.g., a lower RBER threshold for higher ranges of PEC. Furthermore, being able to balance latency and reliability of data in a memory device by using an adaptive RBER threshold can result in overall improvement in performance of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes an RBER threshold management component 113 that can manage selecting the RBER threshold to be used when performing a copyback operation according to the PEC of a destination QLC block. In some embodiments, the memory sub-system controller 115 includes at least a portion of the RBER threshold management component 113. In some embodiments, the RBER threshold management component 113 is part of the host system 110, an application, or an operating system. In other embodiments, local media controller 135 includes at least a portion of RBER threshold management component 113 and is configured to perform the functionality described herein.

The RBER threshold management component 113 can keep track of the PEC of a destination QLC block by maintaining a record of the PEC for the destination QLC block. In response to receiving a request to perform a copyback operation (e.g., move data from SLC memory to QLC memory), the RBER threshold management component 113 can look up (e.g., in a look-up table) a corresponding RBER threshold according to the PEC of the destination QLC block. There can be different RBER thresholds set for different ranges of PEC based on media characterization data (i.e., offline testing of the memory device under different workloads during manufacturing, including read disturb and data retention offline testing on QLC and SLC blocks). After looking up the RBER threshold corresponding to the PEC of the destination QLC block, the RBER threshold management component 113 can compare the RBER of the data to be moved from the SLC memory (i.e., the source data) to the RBER threshold. If the RBER of the data to be moved satisfies the RBER threshold (e.g., if the RBER of the data is less than or equal to the RBER threshold), the RBER threshold management component 113 can select the data path where the data is written directly to the destination QLC block. If the RBER of the data to be moved does not satisfy the RBER threshold (e.g., if the RBER of the data is greater than the RBER threshold), the RBER threshold management component 113 can select the data path where an ECC decoding operation is performed and the corrected data is written to the destination QLC block. Further details with regards to the operations of the RBER threshold management component 113 are described below.

Figure 2:
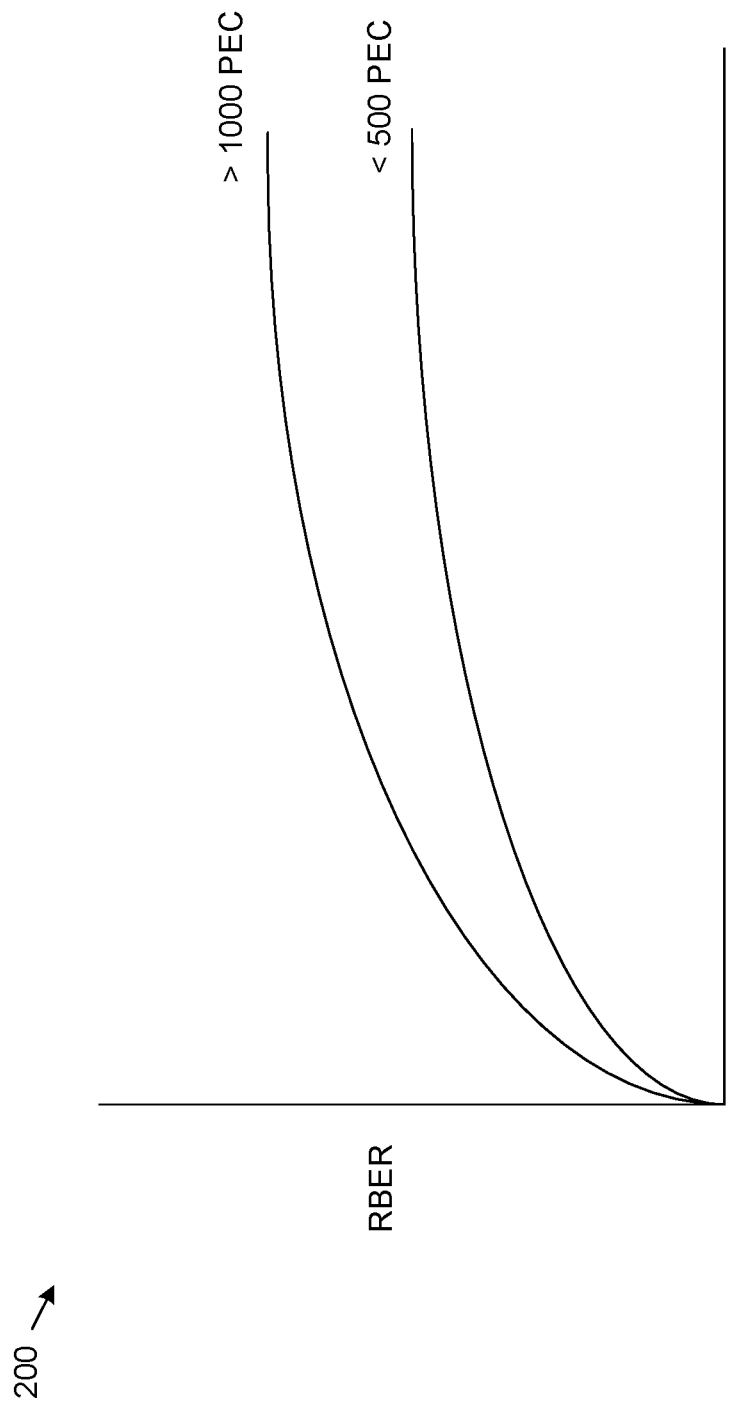
FIG. 2 illustrates the relationship between raw bit error rate (RBER) and program-erase cycle (PEC) for a memory device in accordance with some embodiments of the present disclosure.

FIG. 2 is a graph illustrating the relationship between raw bit error rate (RBER) and program-erase cycle (PEC) for a memory device, in accordance with some embodiments of the present disclosure. As illustrated in FIG. 2, when the PEC count for a memory device is, e.g., 500, the RBER is less in value in comparison to when the PEC count for the memory device is, e.g., 1000. As discussed herein above, the RBER for a particular data of a memory device can vary throughout drive life. At the beginning of life of the memory device (e.g., during a lower PEC), the RBER can be lower than at the end of life (e.g., during a higher PEC). There is thus a need for an adaptive RBER threshold that takes into account the PEC of a destination QLC block as described in more details herein below.

Figure 3:
FIG. 3 illustrates an example look-up table for selecting an RBER threshold corresponding to a PEC range in accordance with some embodiments of the present disclosure.

FIG. 3 illustrates an example look-up table for selecting an RBER threshold corresponding to a PEC range, in accordance with some embodiments of the present disclosure. As illustrated in FIG. 3, there can be a different RBER threshold for different ranges of PEC of a destination QLC block. For example, there can be multiple PEC ranges, e.g., PEC Range 301, PEC Range 303, PEC Range 305, PEC Range 307, and PEC Range 309. Each PEC range can be a range of PECs during a drive life of a memory device ranging from beginning of life to end of life. For each PEC range, there is a different RBER threshold. For example, PEC Range 301 can correspond to an RBER threshold 302; PEC Range 303 can correspond to an RBER threshold 304; PEC Range 305 can correspond to an RBER threshold 306; PEC Range 307 can correspond to an RBER threshold 308; and PEC Range 309 can correspond to an RBER threshold 310. As described in more details herein below, an RBER threshold management component (e.g., the RBER threshold management component 113 of FIG. 1) can set the RBER threshold for performing a copyback operation by looking up the RBER threshold corresponding to the PEC of the destination QLC block. The look-up table can be set according to media characterization data during manufacturing of the memory device (e.g., determining RBER for different PEC under different workloads including read disturb and data retention testing on both QLC and SLC blocks). Further details with regard to the RBER threshold management component and the look-up table is described herein below.

Figure 4:
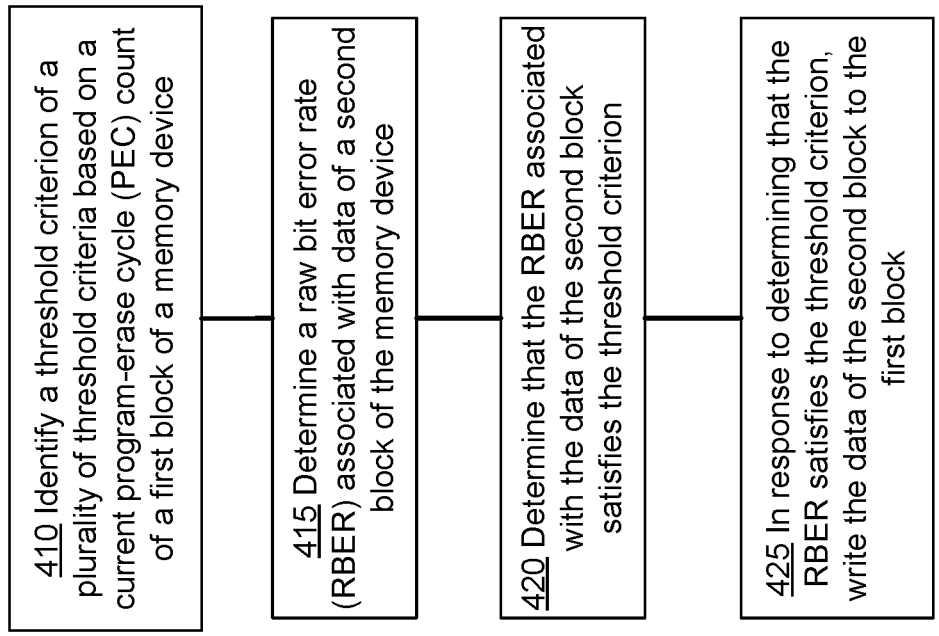
FIG. 4 is a flow diagram of an example method 400 for managing an adaptive data path selection threshold for a memory sub-system in accordance with some embodiments of the present disclosure.

FIG. 4 is a flow diagram of an example method 400 to manage an adaptive data path selection threshold for a memory sub-system, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the RBER threshold management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic selects a threshold criterion of a set of threshold criteria. In some embodiments, the processing logic can select the threshold criterion based on a current program-erase cycle (PEC) count of a block of the memory device. For example, the processing logic can maintain the current PEC count for the block using a counter, where the counter increments by an integer value (e.g., 1) for each PEC of the block. In some embodiments, the processing logic can store the counter in a data structure (e.g., a table) that is accessible to the memory device. In some embodiments, the processing logic can maintain the current PEC count for a block configured as quad-level cell (QLC) memory. In some embodiments, the block can be a destination QLC block in a copyback operation. In some embodiments, the processing logic selects the threshold criterion of the set of threshold criteria in response to receiving a request to perform a copyback operation from a source single-level cell (SLC) block to a destination QLC block. In some embodiments, selecting the threshold criterion of the set of threshold criteria based on the current PEC count includes selecting an entry of a data structure (e.g., a look-up table). Each entry of the data structure can correspond to a different range of PEC counts of the block (e.g., as illustrated in FIG. 3 described herein above). Each entry of the data structure can be associated with a different threshold criterion (e.g., as illustrated in FIG. 3 described herein above). Each threshold criterion can be a threshold raw bit error rate (RBER) criterion. In some embodiments, the processing logic can select the entry of the data structure based on identifying the range of PEC counts within which the current PEC count falls. In response to selecting the entry corresponding to the range of PEC counts within which the current PEC count falls, the processing logic can select the threshold criterion associated with the entry. The processing logic can set the threshold criterion of the plurality of threshold criteria equal to the selected threshold criterion associated with the entry. In some embodiments, the data structure is a look-up table. The look-up table can be constructed using media characterization data (e.g., determining the RBER for different PEC counts under different workloads during offline testing of the memory device at manufacturing, including read disturb and data retention testing on both QLC and SLC blocks). The data structure can be stored in a memory sub-system controller (i.e., the memory sub-system controller 115 illustrated in FIG. 1) and can be accessible to the memory device. In some embodiments, the entries corresponding to lower ranges of PEC counts can each be associated with a higher threshold RBER criterion in comparison to entries corresponding to higher ranges of PEC counts, which can be each associated with a lower threshold RBER criterion.

At operation 415, the processing logic can determine the RBER for data of another block of the memory device. In some embodiments, the other block of the memory device can be configured as SLC memory. In some embodiments, the other block of the memory device can be a source SLC block in a copyback operation. For example, the data of the other block (i.e., the source SLC block) is to be moved to the destination QLC block (i.e., the block described at operation 410) in a copyback operation. In some embodiments, determining the RBER for the data can be based on bit error counts associated with the data.

At operation 420, the processing logic can determine that the RBER associated with the data of the other block (e.g., the source SLC block) satisfies the threshold criterion. In some embodiments, determining that the RBER associated with the data satisfies the threshold criterion includes determining that the RBER associated with the data is greater than the threshold criterion.

At operation 425, in response to determining that the RBER satisfies the threshold criterion, the processing logic can write the data of the source SLC block to the destination QLC block. In some embodiments, writing the data of the source SLC block to the destination QLC block includes reading the data of the source SLC block and writing the read data to the destination QLC block. In some embodiments, the processing logic determines that the RBER associated with the data does not satisfy the threshold criterion (e.g., the RBER associated with the data is less than or equal to the threshold criterion). In response to determining that the RBER associated with the data does not satisfy the threshold criterion, the processing logic can perform an error correction code (ECC) decoding operation on the data. In some embodiments, performing the ECC decoding operation includes reading the data of the source SLC block and correcting the read data. In some embodiments, the processing logic writes the corrected data to the destination QLC block.

Figure 5:
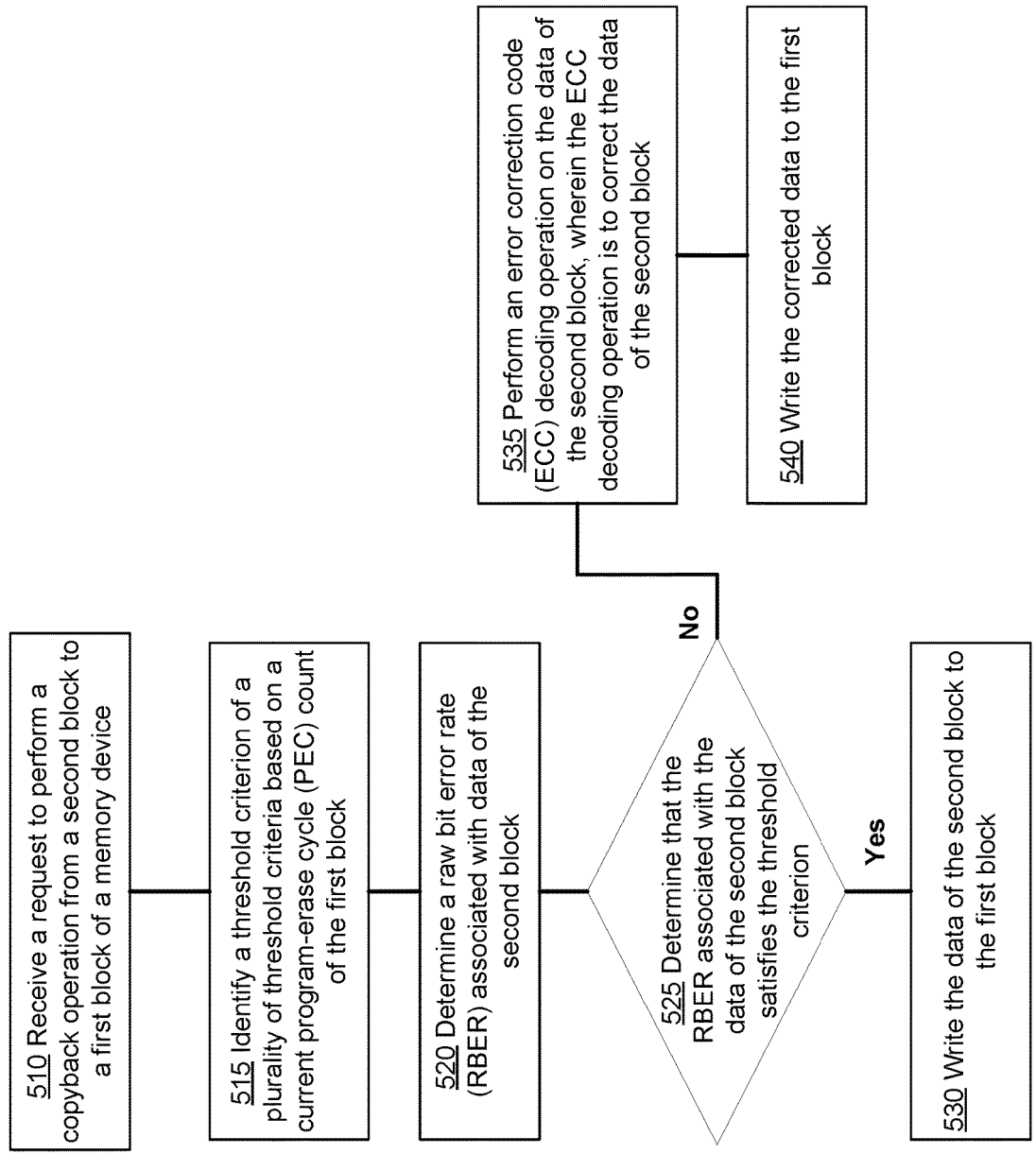
FIG. 5 is a flow diagram of an example method 500 for managing an adaptive data path selection threshold for a memory sub-system in accordance with some embodiments of the present disclosure.

FIG. 5 is a flow diagram of an example method 500 to manage an adaptive data path selection threshold for a memory sub-system, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the RBER threshold management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic receives a request to perform a copyback operation. In some embodiments, the processing logic can receive the request to perform the copyback operation from a source single-level cell (SLC) block to a destination quad-level cell (QLC) block.

At operation 515, the processing logic selects a threshold criterion of a set of threshold criteria. In some embodiments, the processing logic can select the threshold criterion based on a current program-erase cycle (PEC) count of a block of the memory device. For example, the processing logic can maintain the current PEC count for the block using a counter, where the counter increments by an integer value (e.g., 1) for each PEC of the block. In some embodiments, the processing logic can store the counter in a data structure (e.g., a table) that is accessible to the memory device. In some embodiments, the processing logic can maintain the current PEC count for a block configured as quad-level cell (QLC) memory. In some embodiments, the block can be the destination QLC block for the copyback operation described at operation 510. In some embodiments, selecting the threshold criterion of the set of threshold criteria based on the current PEC count includes selecting an entry of a data structure (e.g., a look-up table). Each entry of the data structure can correspond to a different range of PEC counts of the block (e.g., as illustrated in FIG. 3 described herein above). Each entry of the data structure can be associated with a different threshold criterion (e.g., as illustrated in FIG. 3 described herein above). Each threshold criterion can be a threshold raw bit error rate (RBER) criterion. In some embodiments, the processing logic can select the entry of the data structure based on identifying the range of PEC counts within which the current PEC count falls. In response to selecting the entry corresponding to the range of PEC counts within which the current PEC count falls, the processing logic can select the threshold criterion associated with the entry. The processing logic can set the threshold criterion of the plurality of threshold criteria equal to the selected threshold criterion associated with the entry. In some embodiments, the data structure is a look-up table. The look-up table can be constructed using media characterization data (e.g., determining the RBER for different PEC counts under different workloads during offline testing of the memory device at manufacturing, including read disturb and data retention testing on both QLC and SLC blocks). The data structure can be stored in a memory sub-system controller (i.e., the memory sub-system controller 115 illustrated in FIG. 1) and can be accessible to the memory device. In some embodiments, the entries corresponding to lower ranges of PEC counts can each be associated with a higher threshold RBER criterion in comparison to entries corresponding to higher ranges of PEC counts, which can each be associated with a lower threshold RBER criterion.

At operation 520, the processing logic can determine the RBER for data of another block of the memory device. In some embodiments, the other block of the memory device can be configured as SLC memory. In some embodiments, the other block of the memory device can be the source SLC block for the copyback operation described at operation 510. For example, the data of the other block (i.e., the source SLC block) is to be moved to the destination QLC block (i.e., the block described at operation 410) in a copyback operation. In some embodiments, determining the RBER for the data can be based on bit error counts associated with the data.

At operation 525, the processing logic can determine that the RBER associated with the data of the other block (e.g., the source SLC block) satisfies the threshold criterion. In some embodiments, determining that the RBER associated with the data satisfies the threshold criterion includes determining that the RBER associated with the data is greater than the threshold criterion.

At operation 530, in response to determining that the RBER satisfies the threshold criterion, the processing logic can write the data of the source SLC block to the destination QLC block. In some embodiments, writing the data of the source SLC block to the destination QLC block includes reading the data of the source SLC block and writing the read data to the destination QLC block.

At operation 535, in response to determining that the RBER associated with the data does not satisfy the threshold criterion (e.g., the RBER associated with the data is less than or equal to the threshold criterion), the processing logic can perform an error correction code (ECC) decoding operation on the data. In some embodiments, performing the ECC decoding operation includes reading the data of the source SLC block and correcting the read data.

At operation 540, the processing logic writes the corrected data to the destination QLC block.

Figure 6:
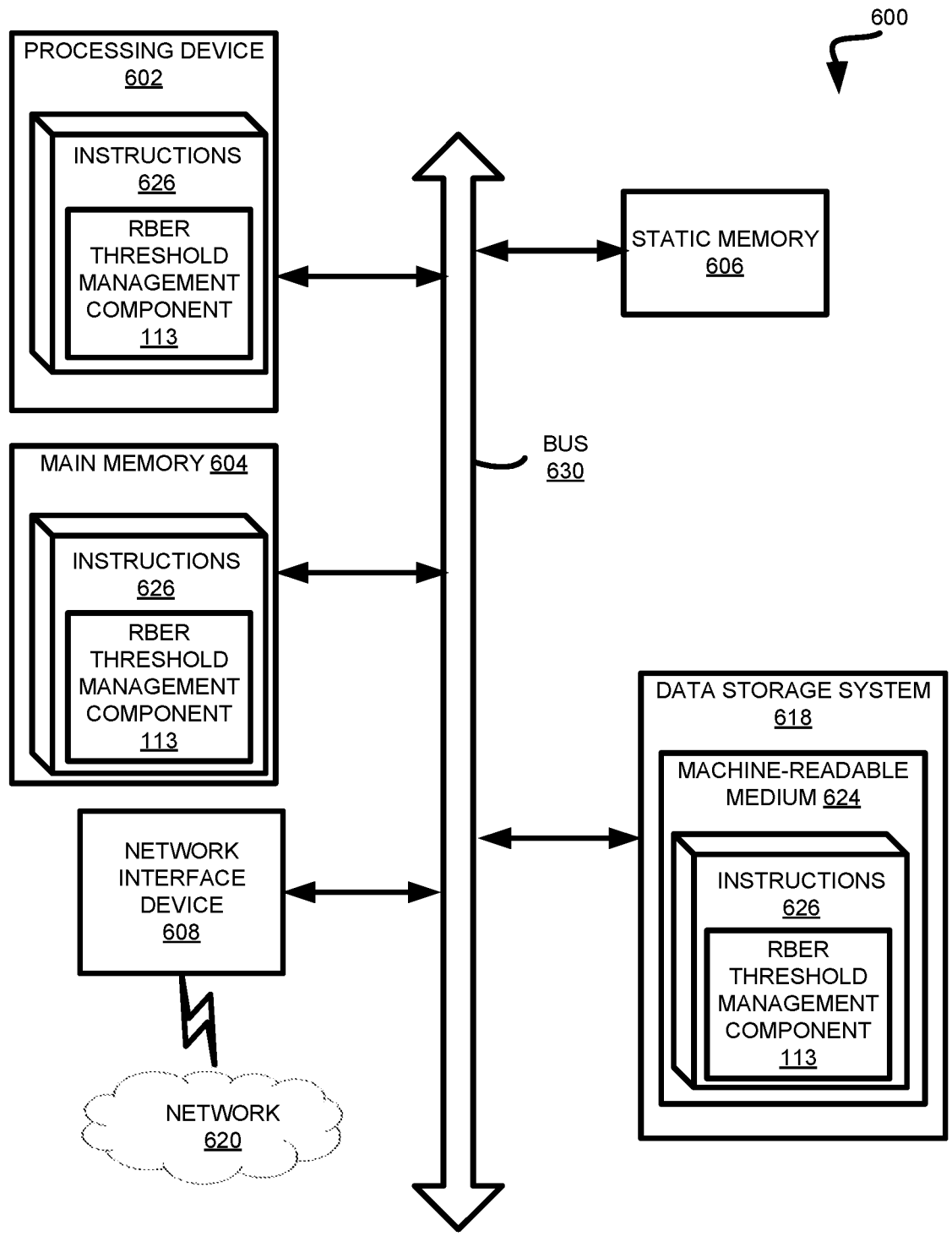
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the RBER threshold management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an RBER threshold management component (e.g., the RBER threshold management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled with the memory device, to perform operations comprising:
   identifying, using a look-up table, a threshold raw bit error rate (RBER) corresponding to a current program-erase cycle (PEC) count of a first block of the memory device;
   determining a RBER value associated with data of a second block of the memory device,
   determining whether the RBER value associated with the data of the second block is less than or equal the threshold RBER; and
   in response to determining that the RBER value is less than or equal the threshold RBER, writing the data of the second block to the first block.

2. The system of claim 1, further comprising:
   in response to determining that the RBER value exceeds the threshold RBER corresponding to the current PEC count of the first block, performing an error correction operation on the data of the second block; and
   writing the corrected data to the first block.

3. The system of claim 1, further comprising:
   receiving, by the processing device, a request to perform a copyback operation from the second block to the first block.

4. The system of claim 1, wherein identifying the threshold RBER further comprises:
   identifying an entry of a data structure, wherein the entry corresponds to a PEC count range that includes the current PEC count; and
   identifying the threshold RBER associated with the entry.

5. The system of claim 4, wherein the data structure comprises a look-up table constructed based on media characterization data.

6. The system of claim 1, wherein the first block comprises a destination block, and wherein the second block comprises a source block.

* * * * *